United States Patent
Zaharchuk et al.

(10) Patent No.: US 11,564,320 B1
(45) Date of Patent: Jan. 24, 2023

(54) FRONT AND REAR BEZELS FOR AN ELECTRICAL OUTLET

(71) Applicant: Lutron Technology Company LLC, Coopersburg, PA (US)

(72) Inventors: Walter S. Zaharchuk, Macungie, PA (US); Jason Edwards Jennings, Macungie, PA (US); Jason O. Adams, Emmaus, PA (US); Jonathan Dersch, Fountain Hill, PA (US); Matt Rad, Pennsburg, PA (US); Karla Sabram, Coopersburg, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 163 days.

(21) Appl. No.: 16/900,323

(22) Filed: Jun. 12, 2020

Related U.S. Application Data

(60) Provisional application No. 62/860,535, filed on Jun. 12, 2019.

(51) Int. Cl.
*H05K 5/00* (2006.01)
*H01R 13/46* (2006.01)

(52) U.S. Cl.
CPC .......... *H05K 5/0017* (2013.01); *H01R 13/46* (2013.01)

(58) Field of Classification Search
CPC .. H01R 13/46; H01R 13/6395–25/006; H05K 5/0017; H02G 3/08; H02G 3/14; H01H 9/0271
See application file for complete search history.

(56) References Cited

U.S. PATENT DOCUMENTS

| | | | |
|---|---|---|---|
| 5,180,886 A | 1/1993 | Dierenbach et al. | |
| 7,728,226 B2* | 6/2010 | Drane | H01R 13/5213 174/67 |
| 8,592,681 B2* | 11/2013 | Alderson | H01H 13/86 174/67 |
| 8,797,723 B2* | 8/2014 | Hilton | H02G 3/14 340/568.4 |
| 9,685,783 B2* | 6/2017 | Raneri | H02J 3/00 |
| 10,535,996 B2* | 1/2020 | Bollinger, Jr. | H01Q 1/38 |
| 2011/0140548 A1 | 6/2011 | Hakkarainen et al. | |

OTHER PUBLICATIONS

Leviton Manufacturing Co., Inc., Renu Receptacle Installation Sheet, 2014, 2 sheets.

* cited by examiner

*Primary Examiner* — Vanessa Girardi
(74) *Attorney, Agent, or Firm* — Michael S. Czarnecki; Philip N. Smith; Glen R. Farbanish

(57) ABSTRACT

An electrical outlet may be stored (e.g., stocked at a manufacturer and/or a warehouse) in a bulk form and may be constructed to have a desired color, finish, and/or material prior to shipment to a customer. The outlet may comprise a rear bezel portion having a front surface with openings configured to receive blades of a plug of an electrical device for electrically connecting the electrical device to a power source and a front bezel portion configured to be mounted over the rear bezel portion. The rear bezel portion may have openings aligned with the respective openings of the rear bezel portion for receiving the blades of the plug. In addition, the electrical outlet may have a temporary bezel when stocked at the manufacturer and/or the warehouse. The temporary bezel may be removed from the outlet and a permanent bezel may be installed on the outlet prior to shipment.

11 Claims, 15 Drawing Sheets

FRONT AND REAR BEZELS FOR AN ELECTRICAL OUTLET

CROSS-REFERENCE TO RELATED APPLICATIONS

This application claims the benefit of U.S. Provisional Patent Application No. 62/860,535, filed Jun. 12, 2019, the entire disclosure of which is hereby incorporated by reference.

BACKGROUND

A typical electrical outlet may be wall-mounted in an electrical wall box and may be electrically connected to a power source, such as an alternative-current (AC) power source. Electrical outlets may include a bezel having one or more receptacles into which plugs of respective electrical loads (e.g., appliances) may be inserted to electrically couple the electrical loads to the power source. The bezel of the electrical outlet may be received in an opening of a faceplate that may be mounted to the electrical wall box. The bezel and/or the faceplate may be provided in a number of colors in order to match the appearance of the electrical outlet to the walls and/or furniture in the vicinity of the electrical wall box.

SUMMARY

As described herein, an electrical outlet may be stored (e.g., stocked at a manufacturer and/or a warehouse) in a bulk form and may be constructed to have a desired color, finish, and/or material prior to shipment to a customer. The outlet may comprise a housing portion having at least one terminal configured to be electrically coupled to a power source, a rear bezel portion having a front surface defining at least two openings configured to receive blades of a plug of an electrical device for electrically connecting the electrical device to the power source, and a front bezel portion configured to be mounted over the rear bezel portion and having at least two openings aligned with the respective openings and configured to receive the blades of the plug of the electrical device. For example, the front bezel portion may comprise a plate portion through which the openings of the front bezel portion extend and two or more snaps extending from a rear surface of the plate portion via respective arms. The snaps may be configured to be received in openings of the front surface of the rear bezel portion for attaching the front bezel portion to the rear bezel portion. In addition, the front bezel portion may comprise a plate portion through which the openings of the front bezel portion extend and sidewalls extending from a rear surface of the plate portion. The front surface of the rear bezel portion may be configured to be received in a recess formed by the plate portion and the sidewalls of the front bezel portion for attaching the front bezel portion to the rear bezel portion.

A method of manufacturing an electrical outlet using front and rear bezel portions is disclosed herein. The method may comprise: (1) storing the electrical outlet with a rear bezel portion installed; (2) installing a front bezel portion on the electrical outlet; and (3) shipping the electrical outlet with the front bezel portion installed. For example, the front bezel portion may be installed on the electrical outlet by receiving snaps of the front bezel portion in respective opening in a front surface of the rear bezel portion. In addition, the front bezel portion may be installed on the electrical outlet by receiving a front surface of the rear bezel portion in a recess formed by a plate portion and sidewalls of the front bezel portion.

In addition, another method of manufacturing an electrical outlet using temporary and permanent bezels is disclosed here. The method may comprise: (1) installing a temporary bezel on the electrical outlet; (2) storing the electrical outlet with the bezel installed; (3) removing the temporary bezel from the electrical outlet; (4) installing a permanent bezel on the electrical outlet; and (5) shipping the electrical outlet with the permanent bezel installed. For example, the temporary bezel may be secured to the electrical outlet using snaps, and the snaps may be cut prior to removing the temporary bezel from the electrical outlet. In addition, the temporary bezel may be secured to the electrical outlet by inserting attachment tabs of the temporary bezel into openings of attachment structures of a housing of the electrical outlet.

DETAILED DESCRIPTION

Figure 1:
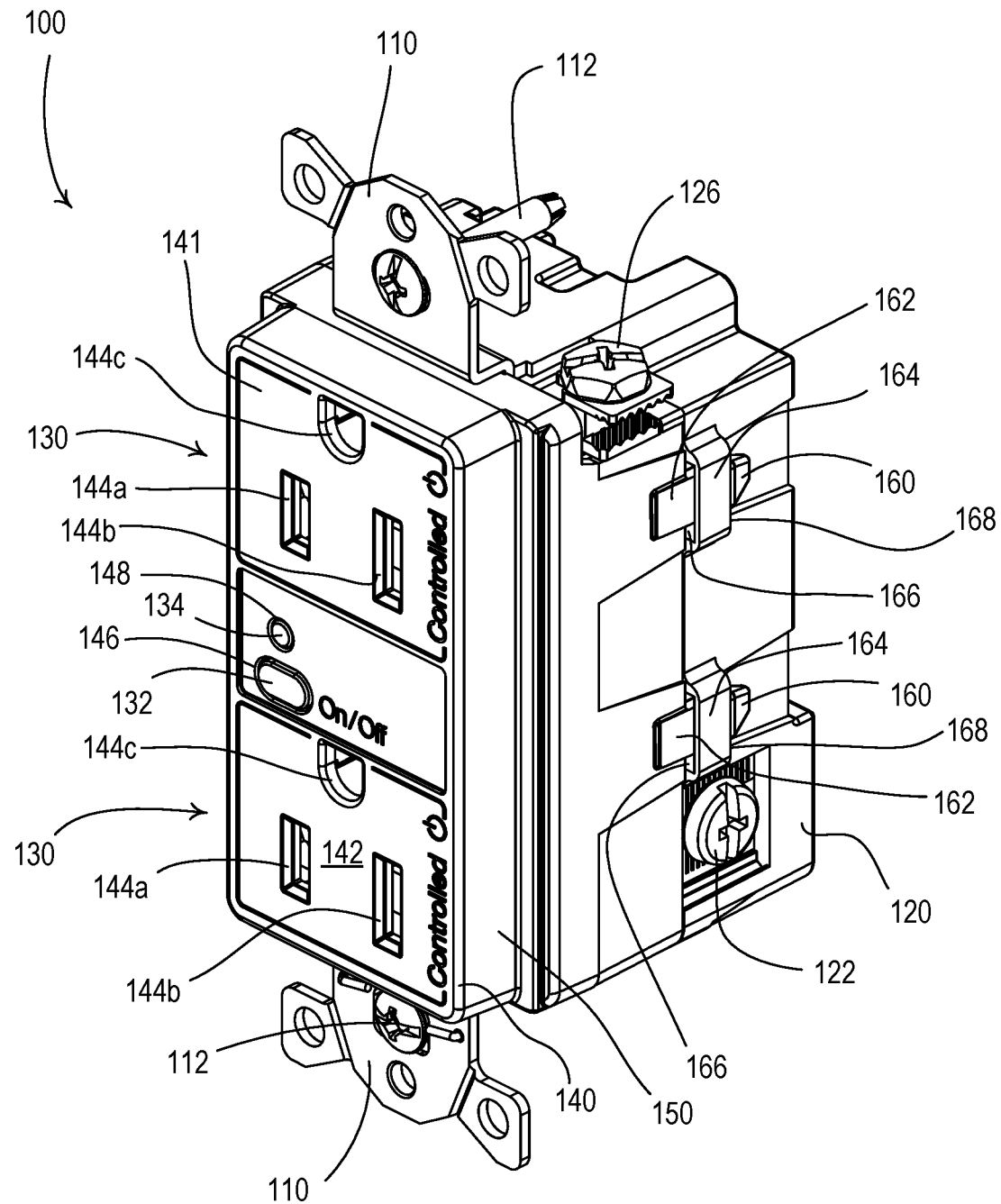
FIG. 1 is a perspective view of an example electrical outlet.
Figure 2:
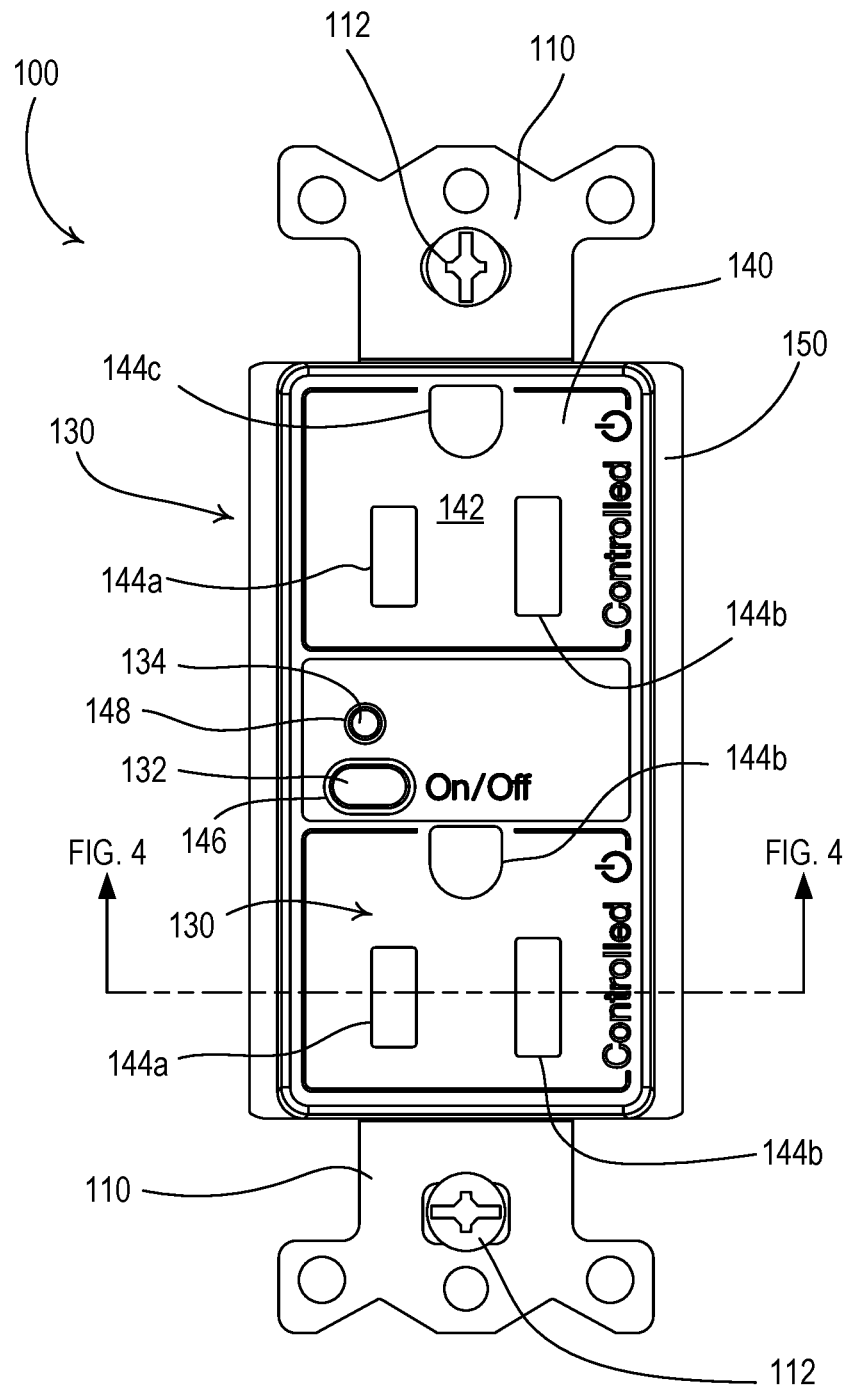
FIG. 2 is a front view of the electrical outlet of FIG. 1.

FIG. 1 is a perspective view and FIG. 2 is a front view of an example electrical outlet 100 (e.g., a controllable electrical outlet). The electrical outlet 100 may comprise a yoke 110 configured to mount the electrical outlet to a standard electrical wall box (not shown) via mounting screws 112. The electrical outlet 100 may include electrical circuitry that may be housed in a housing 120 (e.g., an enclosure) of the controllable electrical outlet 100. The electrical outlet 100 may comprise a hot screw terminal 122 adapted to be electrically connected to the hot side of an alternating-current (AC) power source and a neutral terminal 124 (FIG. 4) adapted to be coupled to the neutral side of the AC power source. The electrical outlet 100 may also comprise a ground terminal 126 that may be connected to the yoke 110 and may be adapted to be electrically connected to earth ground.

The electrical outlet 100 may comprise two receptacles 130 (e.g., an upper receptacle and a lower receptacle) for receiving the plugs of plug-in electrical loads. The electrical outlet 100 may comprise a bezel having and front bezel portion 140 and a rear bezel portion 150. The front bezel portion 140 may define a plate portion 141 having a front surface 142 adapted to be received through an opening of a faceplate (not shown). Each of the receptacles 130 may comprise a number of openings 144a-144c formed in the front surface 142 of the front bezel portion 140 and extending through the plate portion 141 of the front bezel portion 140. For example, each receptacle 130 may comprise a respective hot opening 144a for receiving a hot blade of a plug, a respective neutral opening 144b for receiving a neutral blade of the plug, and a respective ground opening 144c for receiving a ground blade of the plug. The rear bezel portion 150 may be connected to the housing 120. For example, the rear bezel portion 150 may comprise snaps 160 extending from the rear bezel portion 150 via arms 162. The snaps 160 may be configured to engage with respective attachment structures 164 in the housing 120 to connect the rear bezel portion 150 to the housing 120. The arms 162 may be configured to extend through openings 166 of the respective attachment structures 164, such that the snaps 160 are able to engage rear surfaces 168 of the respective attachment structures 164.

The electrical outlet 100 may comprise an actuator 132 that may be provided through an opening 146 in the plate portion 141 of the front bezel portion 140. The actuator 132 may be actuated to associate the electrical outlet 100 with one or more wireless transmitters of a load control system. The actuator 132 may also be actuated to turn on and off the plug-in electrical loads that are plugged into the receptacles 130. The electrical outlet 100 may also comprise a visual indicator 134, which may be provided through an opening 148 in the plate portion 141 of the front bezel portion 140. The visual indicator 134 may be illuminated to provide feedback to a user during configuration and/or normal operation of the electrical outlet 100. For example, the visual indicator 134 may be illuminated by a light source, such as a light-emitting diode (LED) located within the electrical outlet 100 (e.g., inside of the rear bezel portion 150 and/or the housing 120). Examples of controllable receptacles are described in greater detail in commonly-assigned U.S. Patent Application Publication No. 2015/0249337, published Sep. 3, 2015, entitled CONTROLLABLE ELECTRICAL OUTLET WITH A CONTROLLED WIRED OUTPUT, and U.S. Patent Application Publication No. 2017/0310109, published Oct. 26, 2017, entitled CONTROLLABLE ELECTRICAL OUTLET HAVING A RESONANT LOOP ANTENNA, the entire disclosures of which are hereby incorporated by reference.

Figure 3:
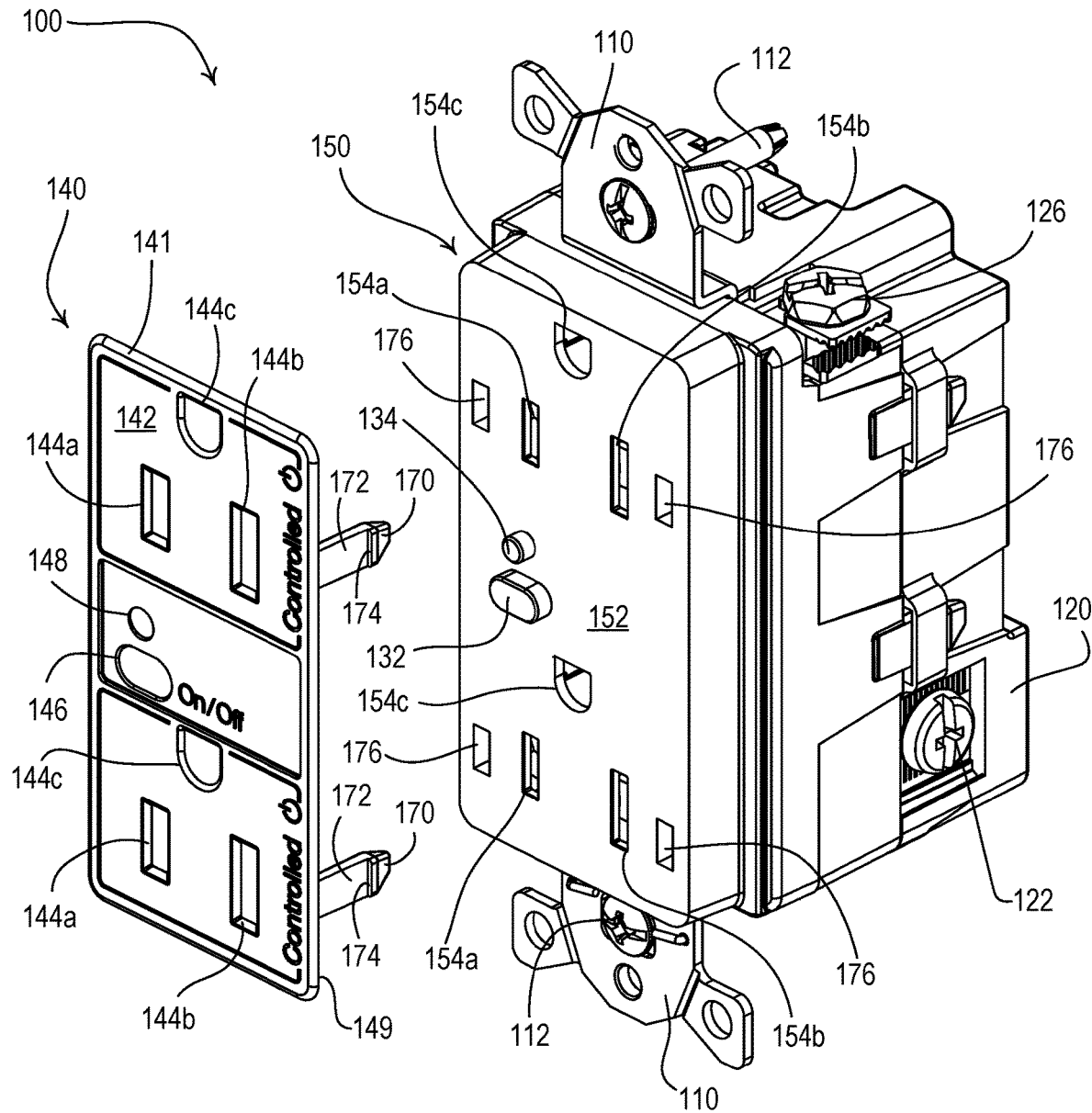
FIG. 3 is an exploded view of the electrical outlet of FIG. 1 showing a front bezel portion detached from a rear bezel portion.

FIG. 3 is an exploded view of the electrical outlet 100 showing the front bezel portion 140 detached from the rear bezel portion 150. The rear bezel portion 150 may define a front surface 152 that may contact a rear surface 149 of the plate portion 141 of the front bezel portion 140 when the front bezel portion 140 is connected to the rear bezel portion 150. Each of the receptacles 130 of the electrical outlet may comprise a number of openings 154a-154c formed in the front surface 152 of the rear bezel portion 150. For example, the rear bezel portion 150 may have a respective hot opening 154a for receiving a hot blade of a plug, a respective neutral opening 154b for receiving a neutral blade of the plug, and a respective ground opening 154c for receiving a ground blade of the plug. The actuator 132 and the visual indicator 134 may extend from the front surface 152 of the rear bezel portion 150. For example, the visual indicator 134 may comprise a light pipe for conducting light from the light source inside of the electrical outlet 100 to the front surface 142 of the front bezel portion 140.

Figure 4:
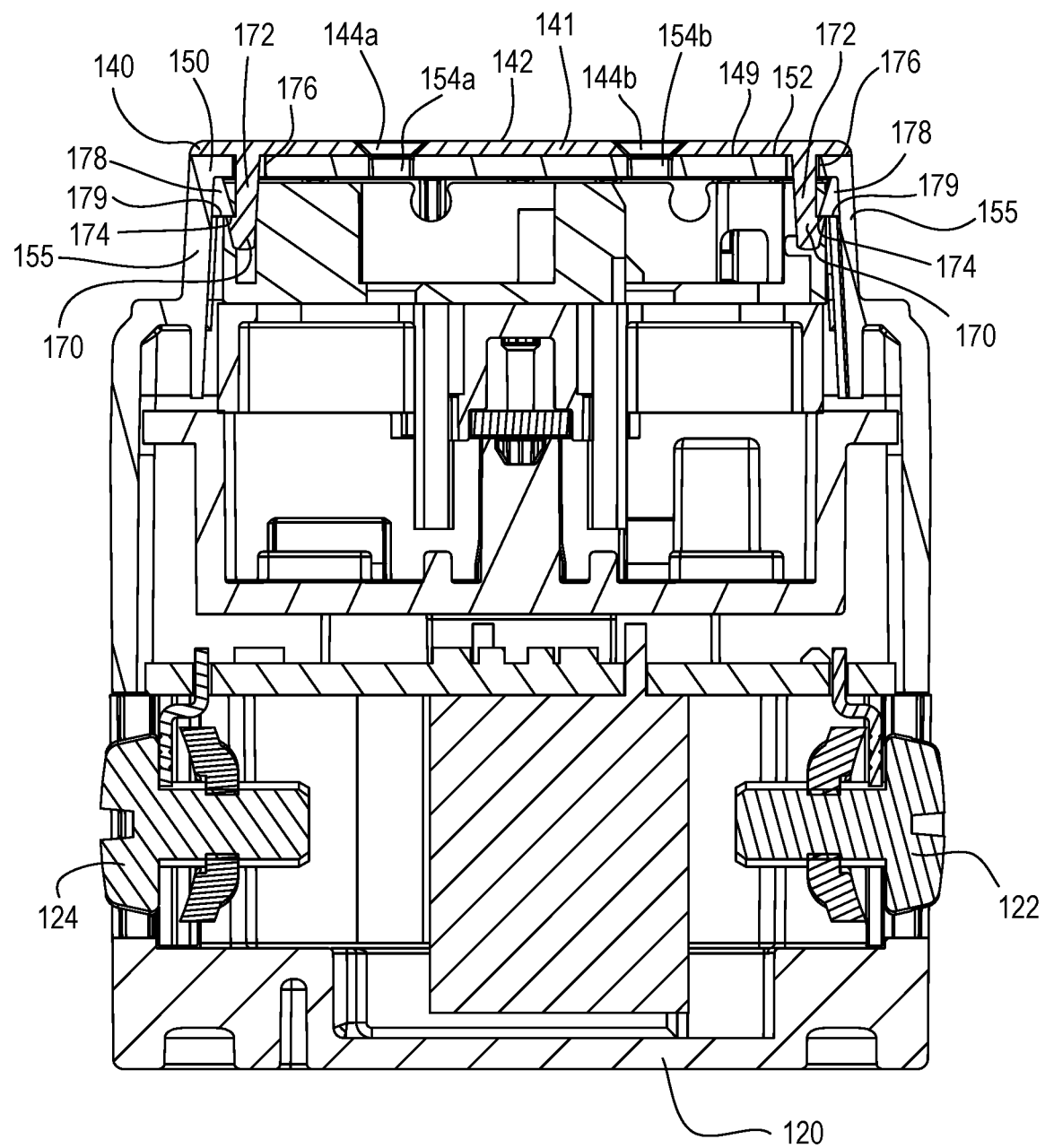
FIG. 4 is a bottom cross-sectional view of the electrical outlet of FIG. 1 taken through the line shown in FIG. 2.

The front bezel portion 140 may comprise a plurality of snaps 170 extending from the rear surface 149 of the plate portion 141 of the front bezel portion 140 via arms 172. FIG. 4 is a bottom cross-sectional view of the electrical outlet 100 taken through the hot and neutral openings 144a, 144b of one of the receptacles 130 (e.g., through the line shown in FIG. 2). The snaps 170 may define engagement surfaces 174. The snaps 170 may be received in respective openings 176 in the front surface 152 of the rear bezel portion 150. The snaps 170 may engage with respective attachment tabs 178 in the housing 120 to connect the front bezel portion 140 to the rear bezel portion 150 (e.g., as shown in FIG. 4). The attachment tabs 178 may extend from sidewalls 155 of the rear bezel portion 150 and may define respective engagement surfaces 179. The arms 172 may be configured to extend through the respective openings 176 in the front surface 152 of the rear bezel portion 150 when the front bezel portion 140 is attached to the rear bezel portion 150. The openings 176 may be large enough to receive the snaps 170 and the arms 172, but not large enough such that a tool or other object may be received in the openings 176 (e.g., and contact the electrical circuitry of the electrical outlet 100). The engagement surfaces 174 of the respective snaps 170 may be configured to contact the engagement surfaces 179 of the respective attachment tabs 178 to hold the front bezel portion 140 against the rear bezel portion 150. When the front bezel portion 140 is connected to the rear bezel portion 150, the rear surface 149 of the front bezel portion 140 may be held against the front surface 152 of the rear bezel portion 150. When the front bezel portion 140 is connected to the rear bezel portion 150, the openings 144a-144c of each receptacle 130 formed in the front surface 142 of the front bezel portion 140 may be aligned with the respective openings 154a-154b of each receptacle 130 formed in the front surface 152 of the rear bezel portion 150.

The electrical outlet 100 may be stored (e.g., stocked at a manufacturer and/or a warehouse) without the front bezel portion 140 connected to the rear bezel portion 150 (e.g., in a bulk form). The front bezel portion 140 may be provided in a number of different colors, finishes, and/or materials. The rear bezel portion 150 may be provided in multiple colors (e.g., two colors, such as white and black). Prior to being shipped to a customer, the front bezel portion 140 (e.g., having the desired color, finish, and/or material) may be attached to the rear bezel portion 150 and the electrical outlet 100 with the front bezel portion 140 installed may be shipped to the customer. Since the rear bezel portion 140 may be seen through an opening between the front bezel portion 140 and the faceplate installed on the electrical outlet 100, the color of the rear bezel portion 150 may be chosen based upon the color of the front bezel portion 140. For example, when the front bezel portion 140 is a lighter color, the rear bezel portion 150 may be white, and when the front bezel portion 140 is a darker color, the rear bezel portion 150 may be black. In addition, the front bezel portion 140 may be attached to the electrical outlet 100 in the field prior to installation (e.g., the electrical outlet 100 may be shipped to the customer without the front bezel portion 140 installed). The snaps 170 and respective attachment tabs 176 may be configured to attach (e.g., permanently attach) the front bezel portion 140 to the rear bezel portion 150 after the front bezel portion 140 is connected to the rear bezel portion 150.

Figure 5:
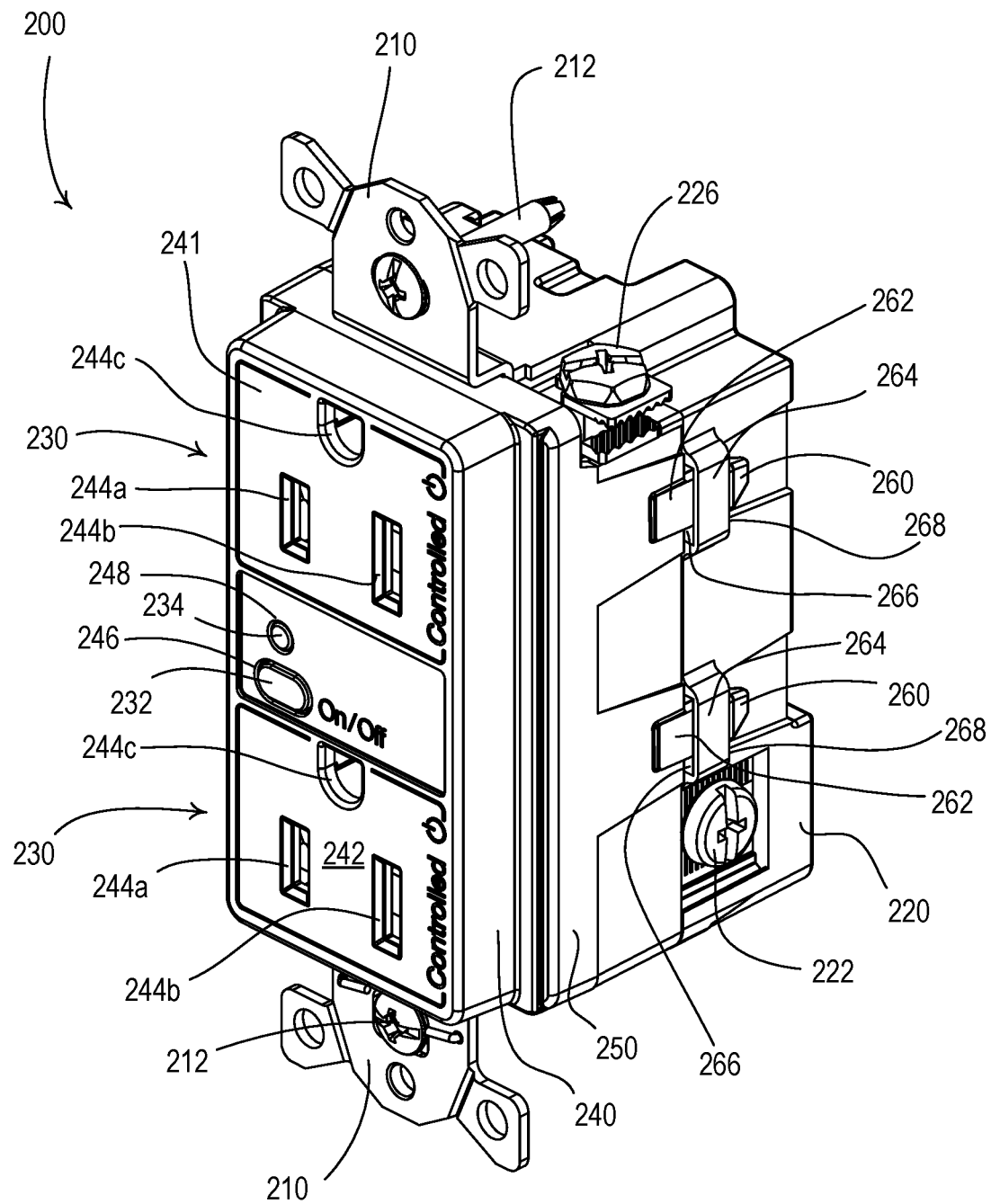
FIG. 5 is a perspective view of another example electrical outlet.
Figure 6:
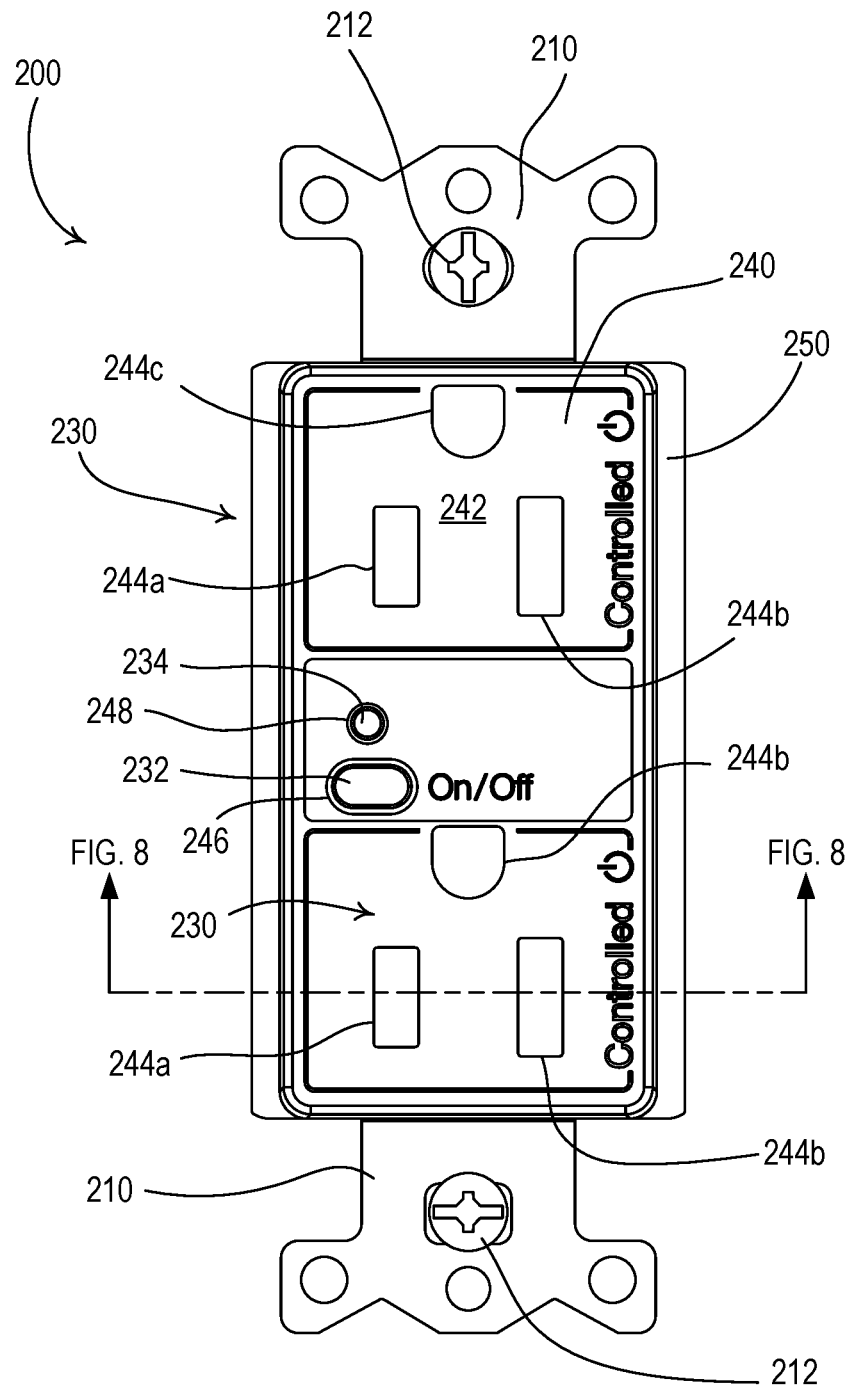
FIG. 6 is a front view of the electrical outlet of FIG. 5.

FIG. 5 is a perspective view and FIG. 6 is a front view of another example electrical outlet 200 (e.g., a controllable electrical outlet). The electrical outlet 200 may comprise a yoke 210 configured to mount the electrical outlet to a standard electrical wall box (not shown) via mounting screws 212. The electrical outlet 200 may include electrical circuitry that may be housed in a housing 220 (e.g., an enclosure) of the controllable electrical outlet 200. The electrical outlet 200 may comprise a hot screw terminal 222 (FIG. 8A) adapted to be electrically connected to the hot side of an AC power source and a neutral terminal 224 (FIG. 8A) adapted to be coupled to the neutral side of the AC power source. The electrical outlet 200 may also comprise a ground terminal 226 that may be connected to the yoke 210 and may be adapted to be electrically connected to earth ground.

The electrical outlet 200 may comprise two receptacles 230 (e.g., an upper receptacle and a lower receptacle) for receiving the plugs of plug-in electrical loads. The electrical outlet 200 may comprise a bezel having and front bezel portion 240 and a rear bezel portion 250. The front bezel portion 240 may define a plate portion 241 having a front surface 242 adapted to be received through an opening of a faceplate (not shown). Each of the receptacles 230 may comprise a number of openings 244a-244c formed in the front surface 242 of the front bezel portion 240 and extending through the plate portion 241 of the front bezel portion 240. For example, each receptacle 230 may comprise a respective hot opening 244a for receiving a hot blade of a plug, a respective neutral opening 244b for receiving a neutral blade of the plug, and a respective ground opening 244c for receiving a ground blade of the plug. The rear bezel portion 250 may be connected to the housing 220. For example, the rear bezel portion 250 may comprise snaps 260 extending from the rear bezel portion 250 via arms 262. The snaps 260 may be configured to engage with respective attachment structures 264 in the housing 220 to connect the rear bezel portion 250 to the housing 220. The arms 262 may be configured to extend through openings 266 of the respective attachment structures 264, such that the snaps 260 are able to engage rear surfaces 268 of the respective attachment structures 264.

The electrical outlet 200 may comprise an actuator 232 that may be provided through an opening 246 in the plate portion 241 of the front bezel portion 240. The actuator 232 may be actuated to associate the electrical outlet 200 with one or more wireless transmitters of a load control system. The actuator 232 may also be actuated to turn on and off the plug-in electrical loads that are plugged into the receptacles 230. The electrical outlet 200 may also comprise a visual indicator 234, which may be provided through an opening 246 in the front bezel portion 240. The visual indicator 234 may be illuminated to provide feedback to a user during configuration and/or normal operation of the electrical outlet 200. For example, the visual indicator 234 may be illuminated by a light source, such as a light-emitting diode (LED) located within the electrical outlet 200 (e.g., inside of the rear bezel portion 250 and/or the housing 220).

Figure 7:
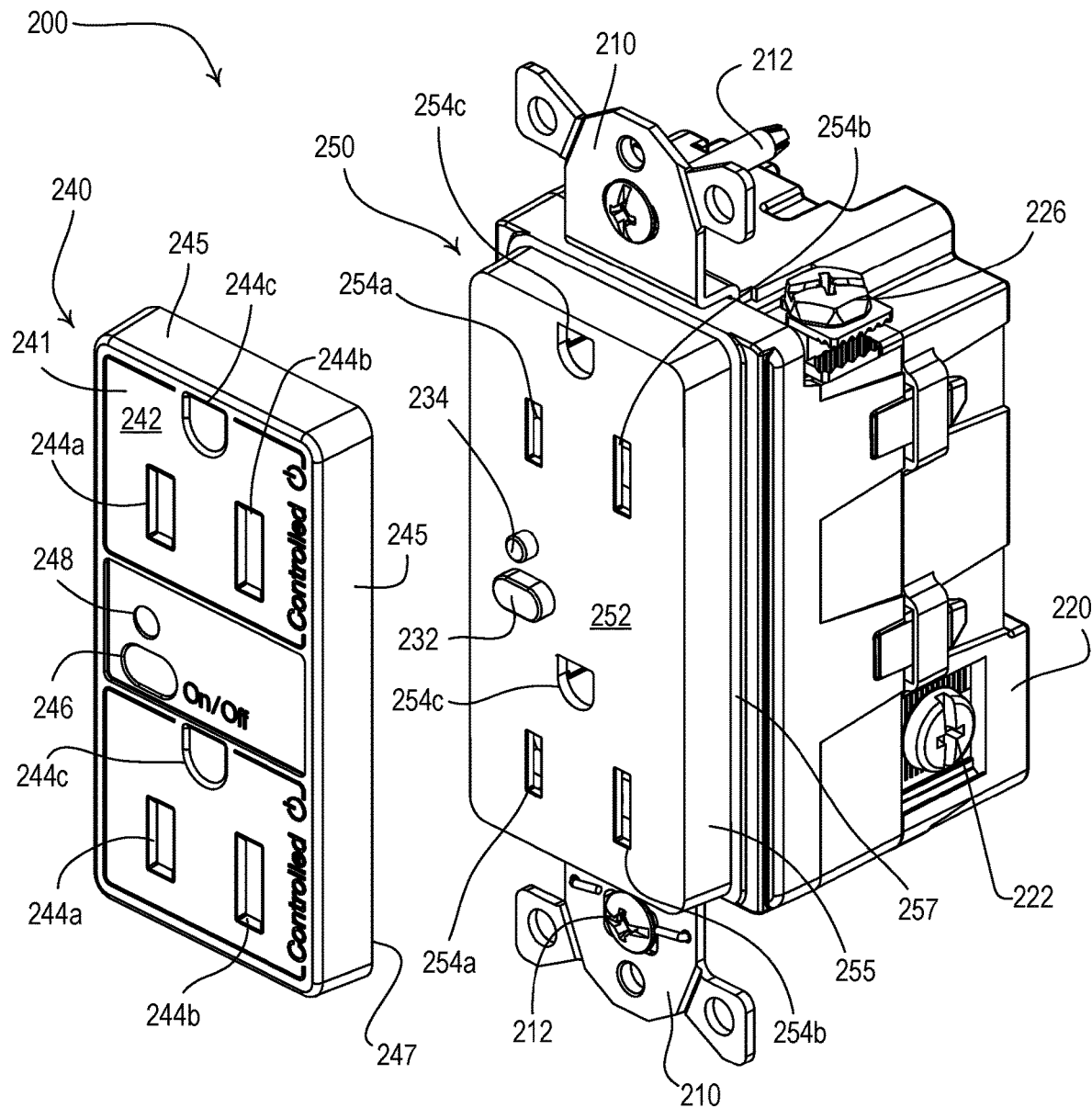
FIG. 7 is an exploded view of the electrical outlet of FIG. 5 showing a front bezel portion detached from a rear bezel portion.

FIG. 7 is an exploded view of the electrical outlet 200 showing the front bezel portion 240 detached from the rear bezel portion 250. The rear bezel portion 250 may define a front surface 252 that may contact an internal rear surface 249 (FIG. 8A) of the plate portion 241 of the front bezel portion 240 when the front bezel portion 240 is connected to the rear bezel portion 250. Each of the receptacles 230 of the electrical outlet may comprise a number of openings 254a-254c formed in the front surface 252 of the rear bezel portion 250. For example, the rear bezel portion 250 may have a respective hot opening 254a for receiving a hot blade of a plug, a respective neutral opening 254b for receiving a neutral blade of the plug, and a respective ground opening 254c for receiving a ground blade of the plug. The actuator 232 and the visual indicator 234 may extend from the front surface 252 of the rear bezel portion 250. For example, the visual indicator 234 may comprise a light pipe for conducting light from the light source inside of the electrical outlet 200 to the front surface 242 of the front bezel portion 240.

Figure 8A:
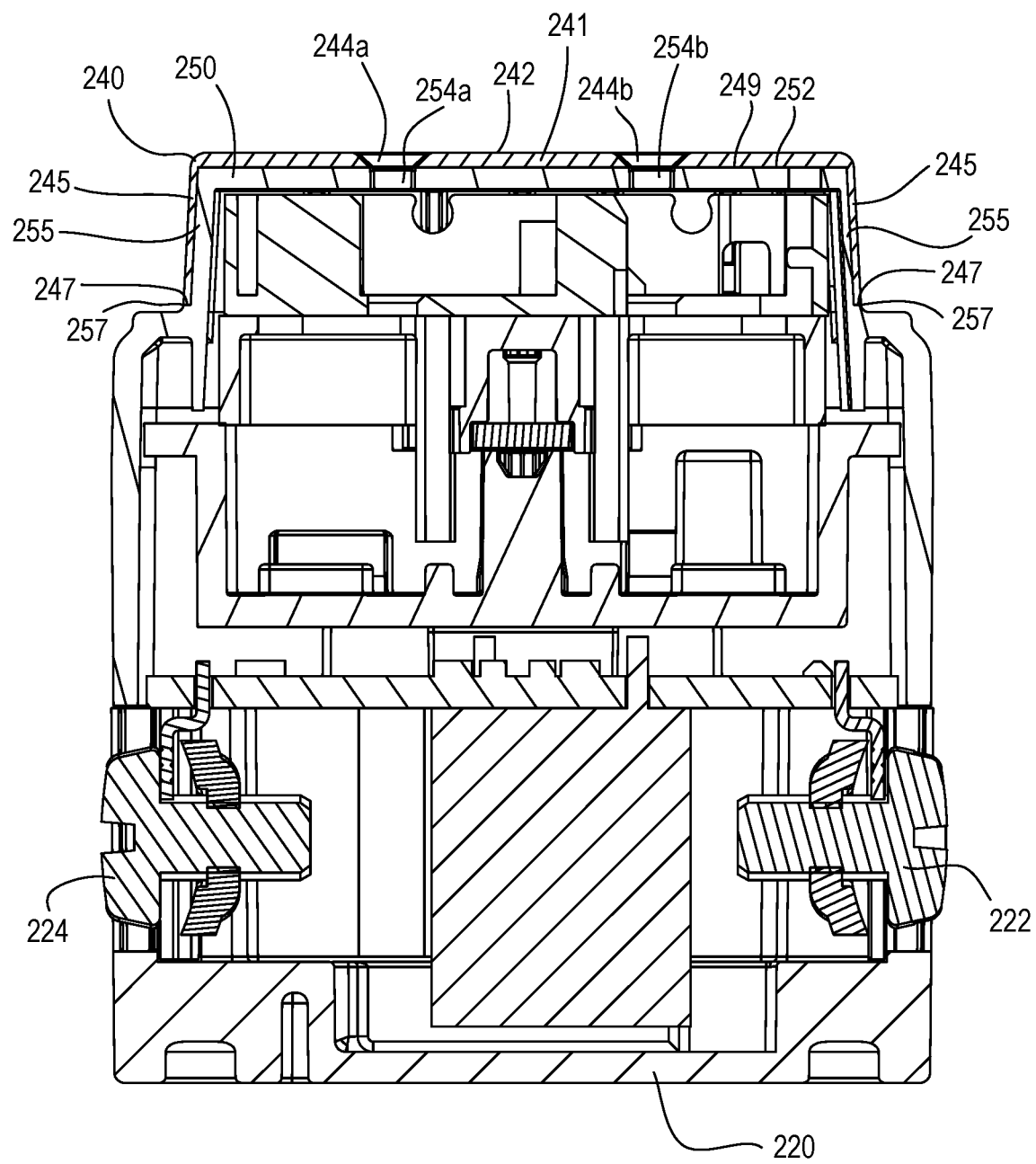
FIGS. 8A and 8B are bottom cross-sectional views of the electrical outlet of FIG. 5 taken through the line shown in FIG. 6.
Figure 8B:
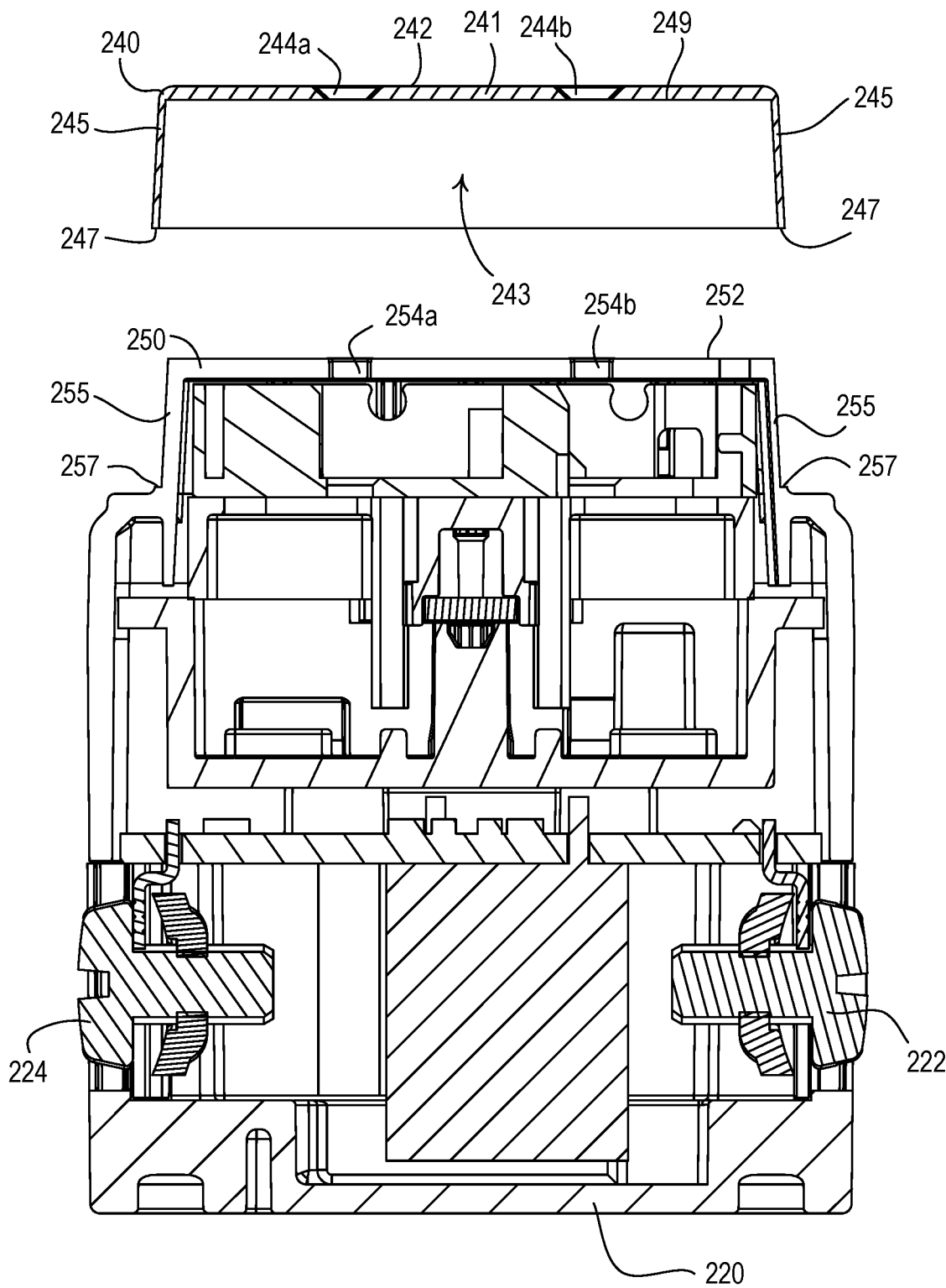

FIGS. 8A and 8B are bottom cross-sectional views of the electrical outlet 200 taken through the hot and neutral openings 244a, 244b of one of the receptacles 230 (e.g., through the line shown in FIG. 6). The front bezel portion 240 is attached to the electrical outlet 200 in FIG. 8A and detached from the electrical outlet 200 in FIG. 8B. The front bezel portion 240 may comprise sidewalls 245 that extend from the plate portion 241 around all sides of the front bezel portion 250. The front surface 242 and the sidewalls 245 of the front bezel portion 240 may define a recess 243 in the rear side of the front bezel portion 240. The front surface 252 of the rear bezel portion 250 may be received in the recess 243 of the front bezel portion 240, such that the sidewalls 245 of the front bezel surface 242 surround sidewalls 255 of the rear bezel portion 250 (e.g., the area of the front surface 252 of the rear bezel portion 250 of the electrical outlet 200 shown in FIG. 7 may be smaller than the area of the front surface 152 of the rear bezel portion 150 of the electrical outlet 100 shown in FIG. 3). When the front bezel portion 240 is installed on the rear bezel portion 250, sidewall edges 247 may contact a ridge 257 of the rear bezel portion 250 that surrounds the sidewalls 255 of the rear bezel portion 250. The sidewalls 245 of the front bezel portion 242 may extend parallel to the sidewall 255 of the rear bezel portion 250. For example, a combined thickness of each sidewall 245 of the front bezel portion 240 and the adjacent sidewall 255 of the rear bezel portion 250 may be approximately the same of the thickness of the corresponding sidewall 155 of the rear bezel portion 150 of the electrical outlet 100 shown in FIG. 4. When the front bezel portion 240 is connected to the rear bezel portion 250, the rear surface 249 of the front bezel portion 240 may be held against the front surface 252 of the rear bezel portion 250. The openings 244a-244c of each receptacle 230 formed in the front surface 242 of the front bezel portion 240 may be aligned with the respective openings 254a-254c of each receptacle 230 formed in the front surface 252 of the rear bezel portion 250 when the front bezel portion 240 is connected to the rear bezel portion 250.

The sidewalls 245 of the front bezel portion 242 may allow for connection of the front bezel portion 240 to the rear bezel portion 250 (e.g., the front bezel portion 240 may not comprise snaps, such as the snaps 170 of the front bezel portion 140 shown in FIG. 3). For example, the sidewalls 245 of the front bezel portion 242 may contact the sidewalls 255 of the rear bezel portion 250 to attach the front bezel portion 242 to the rear bezel portion 250 (e.g., via a press fit or a friction fit). In addition, the sidewalls 245 of the front bezel portion 242 may be adhered to (e.g., permanently affixed to) the sidewalls 255 of the rear bezel portion 250 (e.g., via an ultrasonic welding process or use of an adhesive). Further, the sidewalls 245 of the front bezel portion 242 may comprise snaps (not shown) configured to be received in respective openings (not shown) in the sidewalls 255 of the rear bezel portion 250.

The electrical outlet 200 may be stored (e.g., stocked at a manufacturer and/or a warehouse) without the front bezel portion 240 connected to the rear bezel portion 250 (e.g., in a bulk form). The front bezel portion 240 may be provided in a number of different colors, finishes, and/or materials. Prior to being shipped to a customer, the front bezel portion 240 (e.g., having the desired color, finish, and/or material) may be attached to the rear bezel portion 250 and the electrical outlet 200 with the front bezel portion 240 installed may be shipped to the customer. In addition, the front bezel portion 240 may be attached to the electrical outlet 200 in the field prior to installation (e.g., the electrical outlet 200 may be shipped to the customer without the front bezel portion 240 installed).

Figure 9:
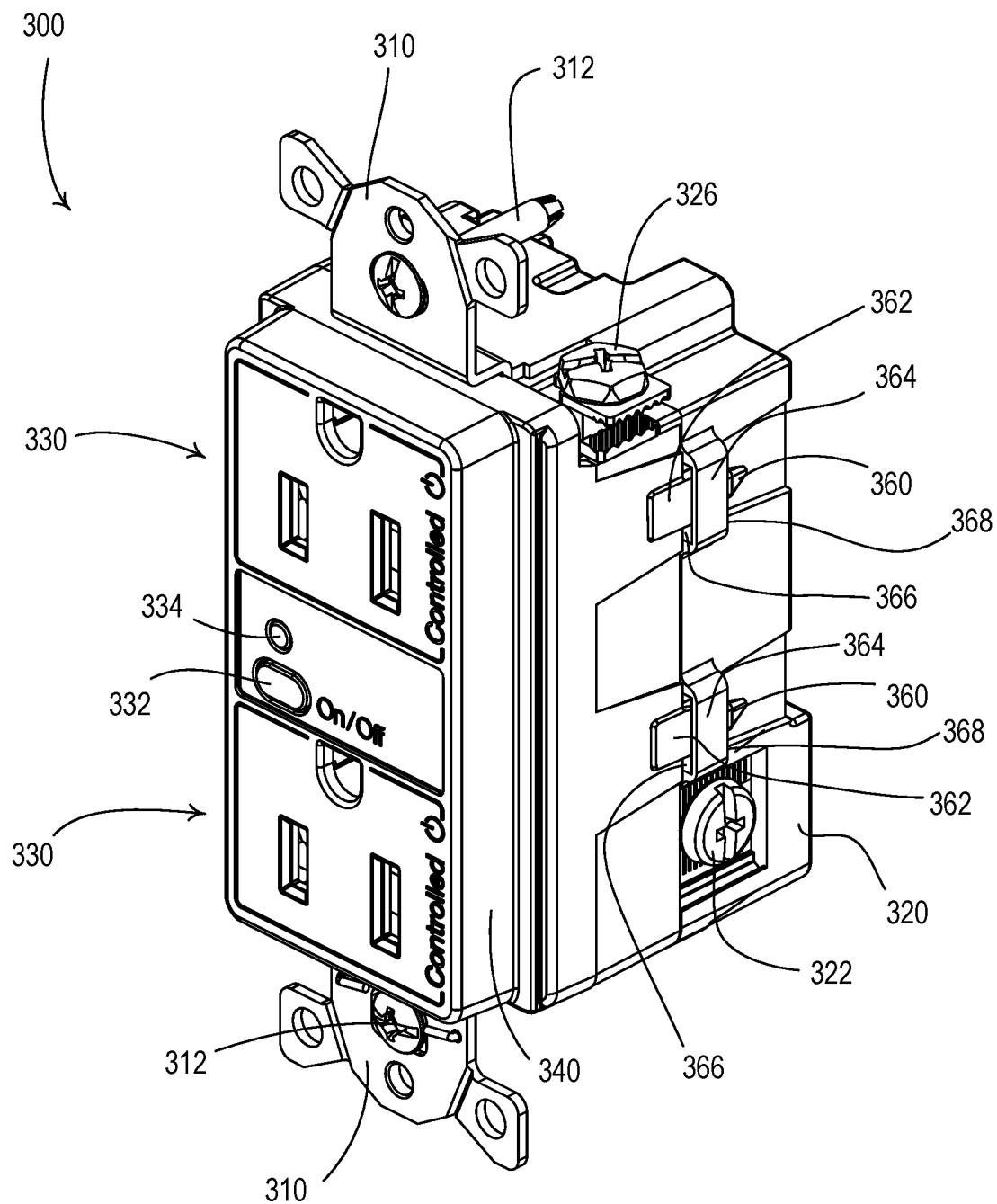
FIG. 9 is a perspective view of another example electrical outlet.

FIG. 9 is a perspective view of another example electrical outlet 300 (e.g., a controllable electrical outlet). The electrical outlet 300 may comprise a yoke 310 configured to mount the electrical outlet to a standard electrical wall box (not shown) via mounting screws 312. The electrical outlet 300 may include electrical circuitry that may be housed in a housing 320 (e.g., an enclosure) of the controllable electrical outlet 300. The electrical outlet 300 may comprise a hot screw terminal 322 adapted to be electrically connected to the hot side of an AC power source and a neutral terminal 324 (not shown) adapted to be coupled to the neutral side of the AC power source. The electrical outlet 300 may also comprise a ground terminal 326 that may be connected to the yoke 310 and may be adapted to be electrically connected to earth ground.

The electrical outlet 300 may comprise two receptacles 330 (e.g., an upper receptacle and a lower receptacle) for receiving the plugs of plug-in electrical loads. The electrical outlet 300 may comprise an actuator 332 that may be actuated to associate the electrical outlet 300 with one or more wireless transmitters of a load control system. The actuator 332 may also be actuated to turn on and off the plug-in electrical loads that are plugged into the receptacles 330. The electrical outlet 300 may also comprise a visual indicator 334, which may be illuminated to provide feedback to a user during configuration and/or normal operation of the electrical outlet 300. For example, the visual indicator 334 may be illuminated by a light source, such as an LED located inside of the electrical outlet 300.

Figure 10:
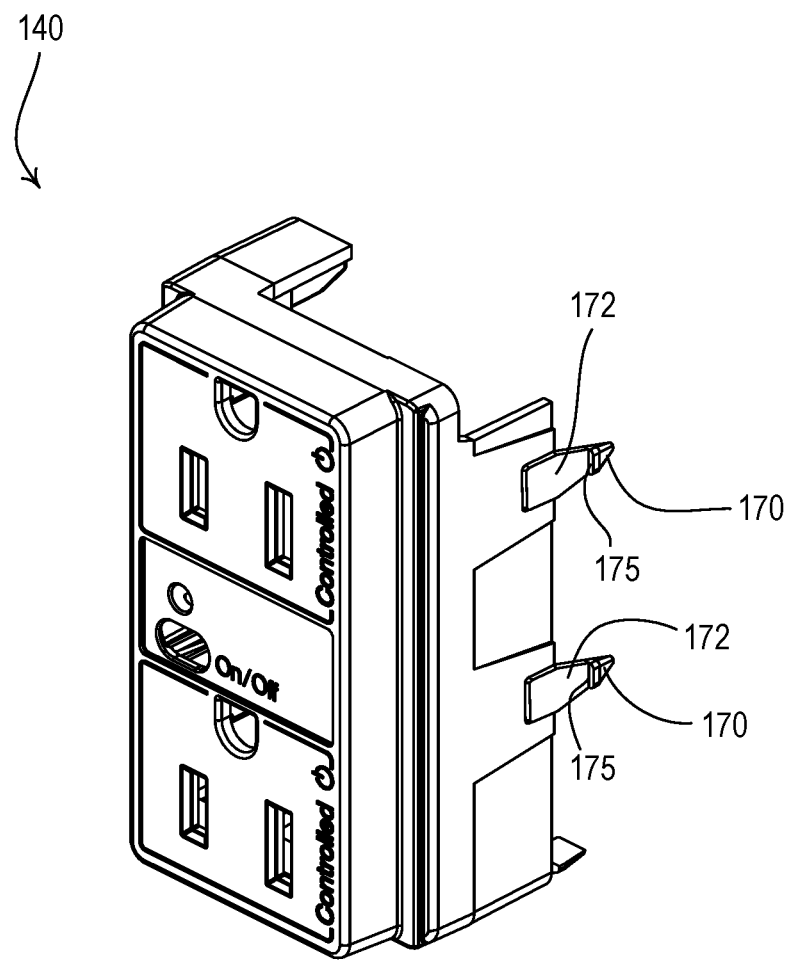
FIG. 10 is a perspective view of a temporary bezel of the electrical outlet of FIG. 9.

The electrical outlet 300 may comprise a temporary bezel 340 that may be connected (e.g., temporarily connected) to the housing 320. FIG. 10 is a perspective view of the temporary bezel 340. The temporary bezel 340 may comprise, for example, snaps 360 (e.g., thin snaps) extending from the temporary bezel 340 via arms 362. The snaps 360 may be configured to engage with respective attachment structures 364 in the housing 320 to connect the temporary bezel 340 to the housing 320. The snaps 360 may comprise respective engagement surfaces 365. The arms 362 may be configured to extend through openings 366 of the respective attachment structures 364, such that the engagement surfaces 365 of the snaps 360 are able to engage engagement surfaces 368 of the respective attachment structures 364. The snaps 360 may be thin (e.g., smaller than the snaps 160, 260 of the electrical outlets 100, 200, respectively), such that the snaps 360 may be easily cut to allow the temporary bezel 340 to be detached from the housing 320.

Figure 11:
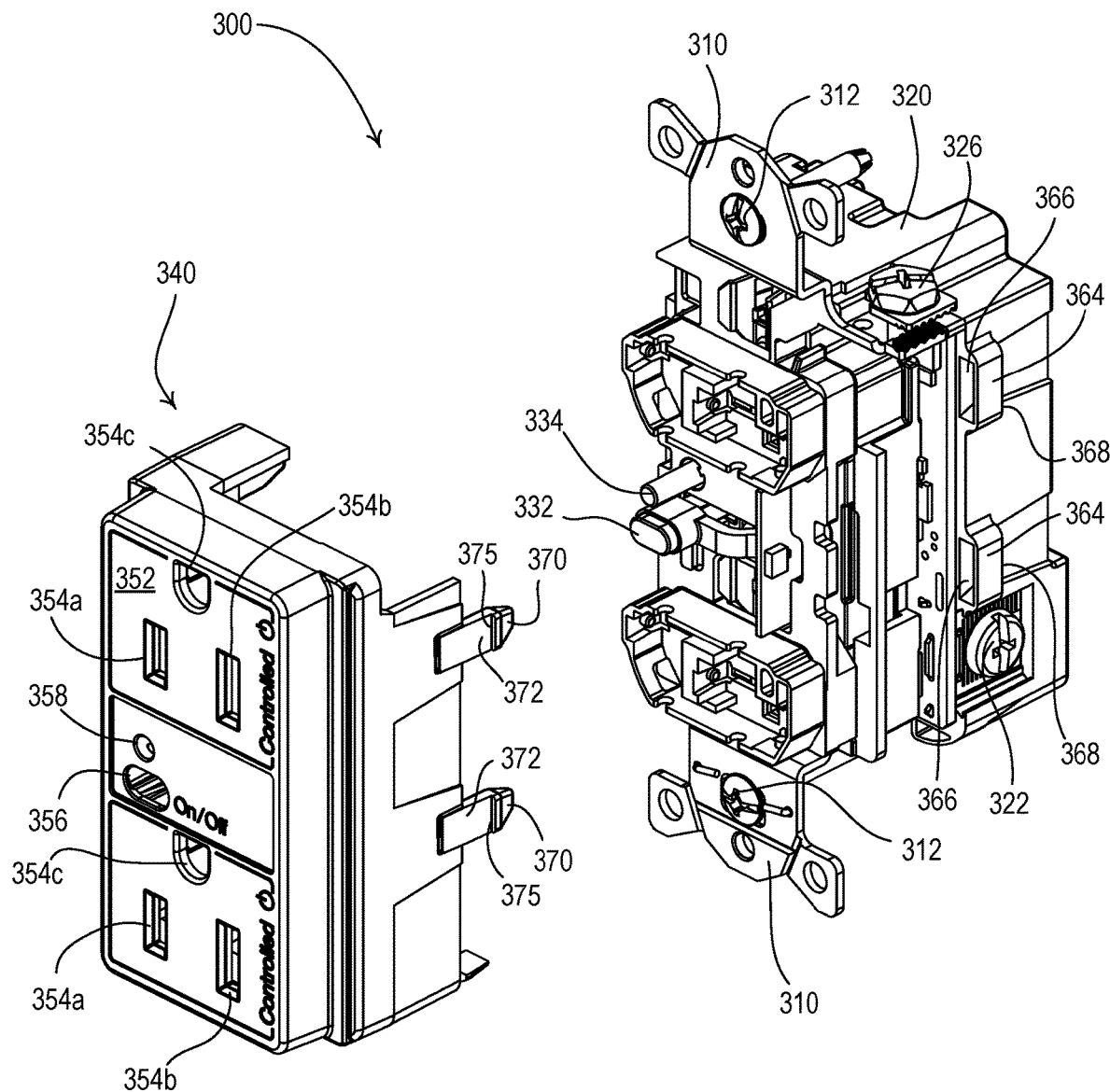
FIG. 11 is a perspective view of the electrical outlet of FIG. 9 before a permanent bezel is installed on the electrical outlet.
Figure 12:
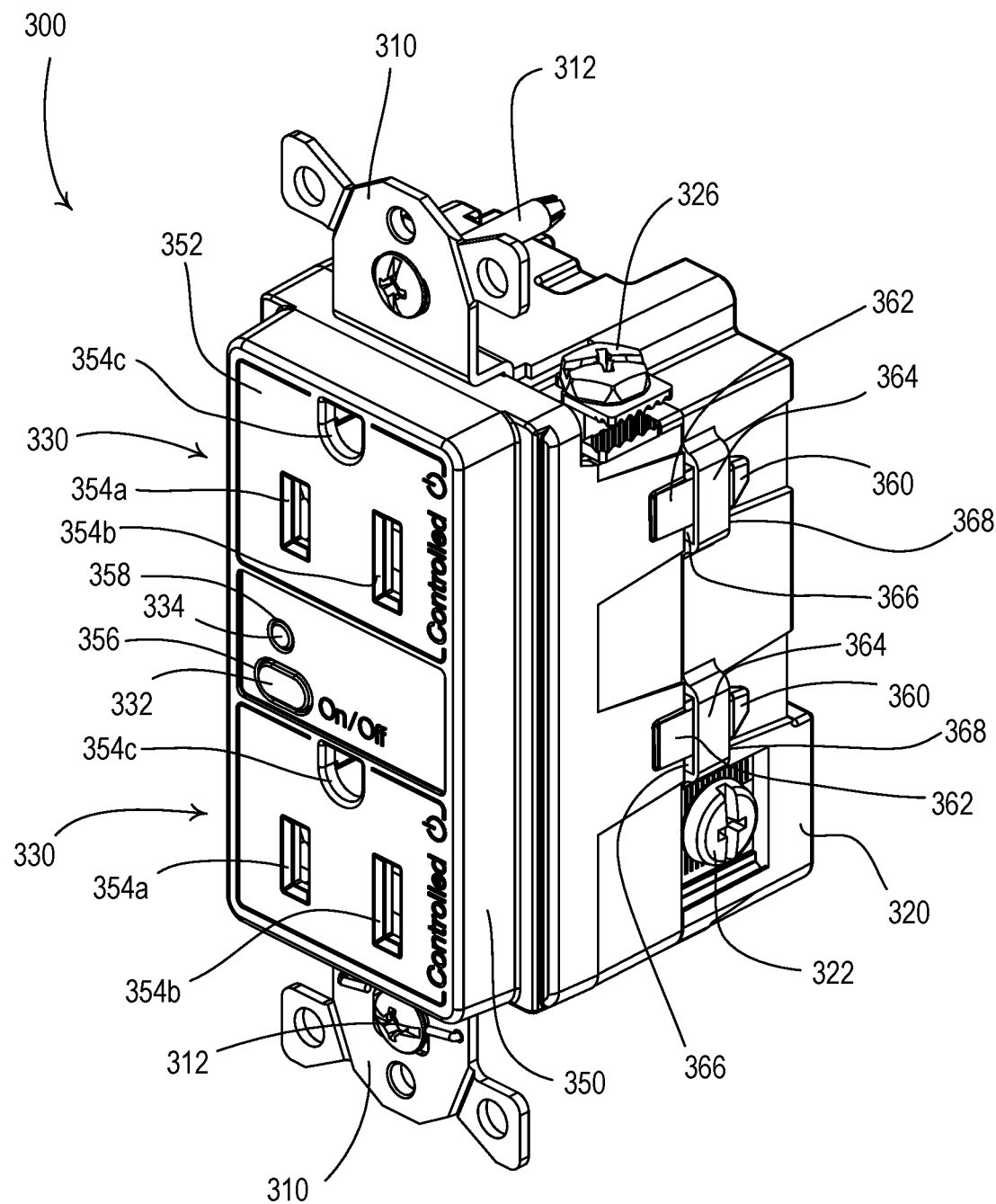
FIG. 12 is a perspective view of the electrical outlet of FIG. 9 with the permanent bezel installed on the electrical outlet.

After the temporary bezel 340 is detached from the housing 320, a permanent bezel 350 may be installed on (e.g., permanently connected to) the electrical outlet 300. FIG. 11 is a perspective view of the electrical outlet 300 before the permanent bezel 350 is installed on the electrical outlet 300. FIG. 12 is a perspective view of the electrical outlet 300 with the permanent bezel 350 installed on the electrical outlet 300. The permanent bezel 350 may comprise snaps 370 extending from the permanent bezel 350 via arms 372. The snaps 360 may comprise respective engagement surfaces 375. The snaps 370 and arm 372 may be inserted into the openings 366 of the respective attachment structures 364 until the engagement surfaces 375 of the snaps 370 engage with the engagement surfaces 368 of the respective attachment structures 364 to connect the permanent bezel 350 to the housing 320. As shown in FIG. 12, each of the receptacles 330 may comprise a number of openings 354a-354c formed in a front surface 352 of the permanent bezel 350. For example, each receptacle 330 may comprise a respective hot opening 354a for receiving a hot blade of a plug, a respective neutral opening 354b for receiving a neutral blade of the plug, and a respective ground opening 354c for receiving a ground blade of the plug. The actuator 332 and the visual indicator 334 may be provided through respective openings 356, 358 in the permanent bezel 350.

Figure 13:
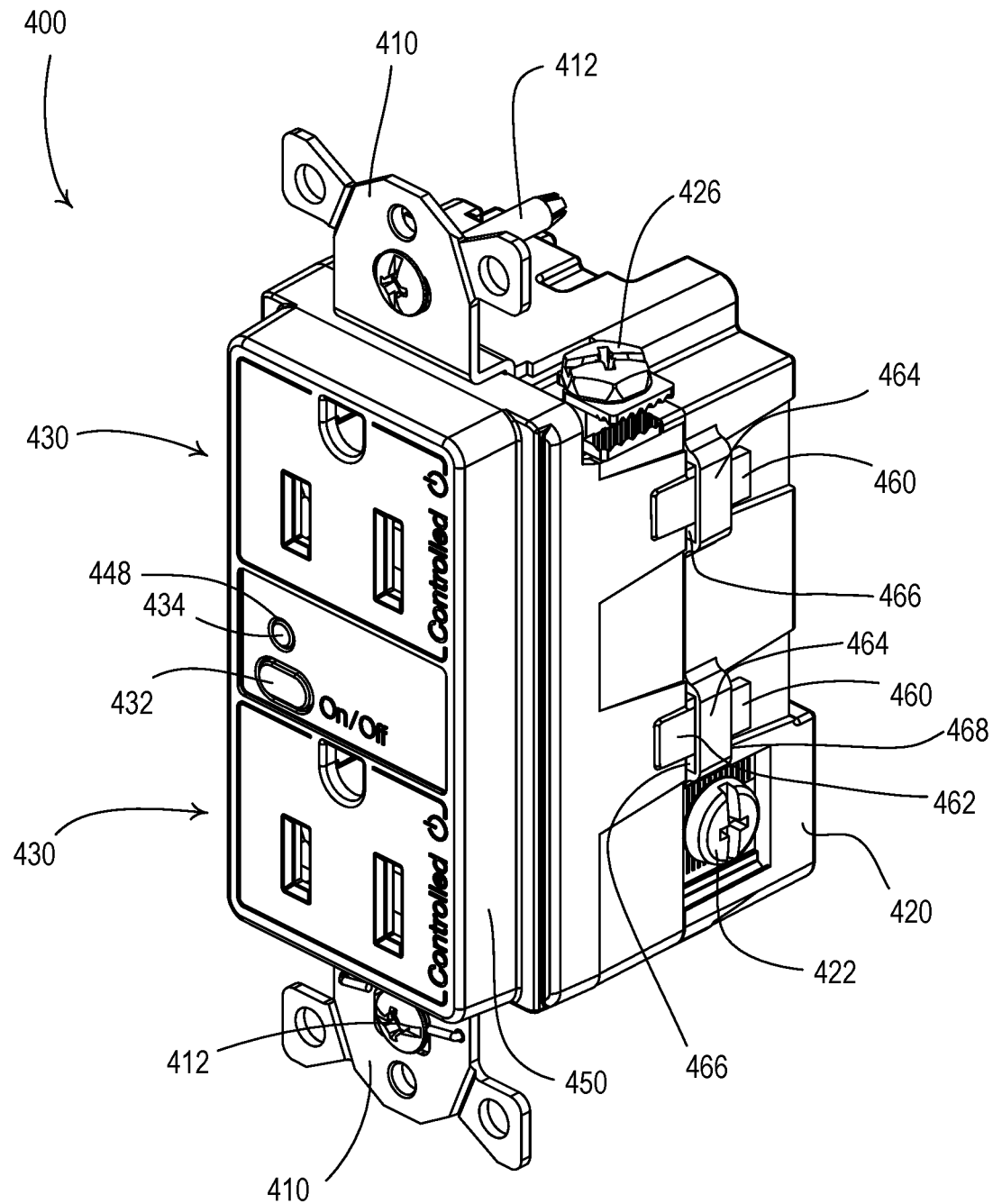
FIG. 13 is perspective view of another example electrical outlet.

FIG. 13 is a perspective view of another example electrical outlet 400 (e.g., a controllable electrical outlet). The electrical outlet 400 may comprise a yoke 410 configured to mount the electrical outlet to a standard electrical wall box (not shown) via mounting screws 412. The electrical outlet 400 may include electrical circuitry that may be housed in a housing 420 (e.g., an enclosure) of the controllable electrical outlet 400. The electrical outlet 400 may comprise a hot screw terminal 422 adapted to be electrically connected to the hot side of an AC power source and a neutral terminal 424 (not shown) adapted to be coupled to the neutral side of the AC power source. The electrical outlet 400 may also comprise a ground terminal 426 that may be connected to the yoke 410 and may be adapted to be electrically connected to earth ground.

The electrical outlet 400 may comprise two receptacles 430 (e.g., an upper receptacle and a lower receptacle) for receiving the plugs of plug-in electrical loads. The electrical outlet 400 may comprise an actuator 432 that may be actuated to associate the electrical outlet 400 with one or more wireless transmitters of a load control system. The actuator 432 may also be actuated to turn on and off the plug-in electrical loads that are plugged into the receptacles 430. The electrical outlet 400 may also comprise a visual indicator 434, which may be illuminated to provide feedback to a user during configuration and/or normal operation of the electrical outlet 400. For example, the visual indicator 434 may be illuminated by a light source, such as an LED located inside of the electrical outlet 400.

Figure 14:
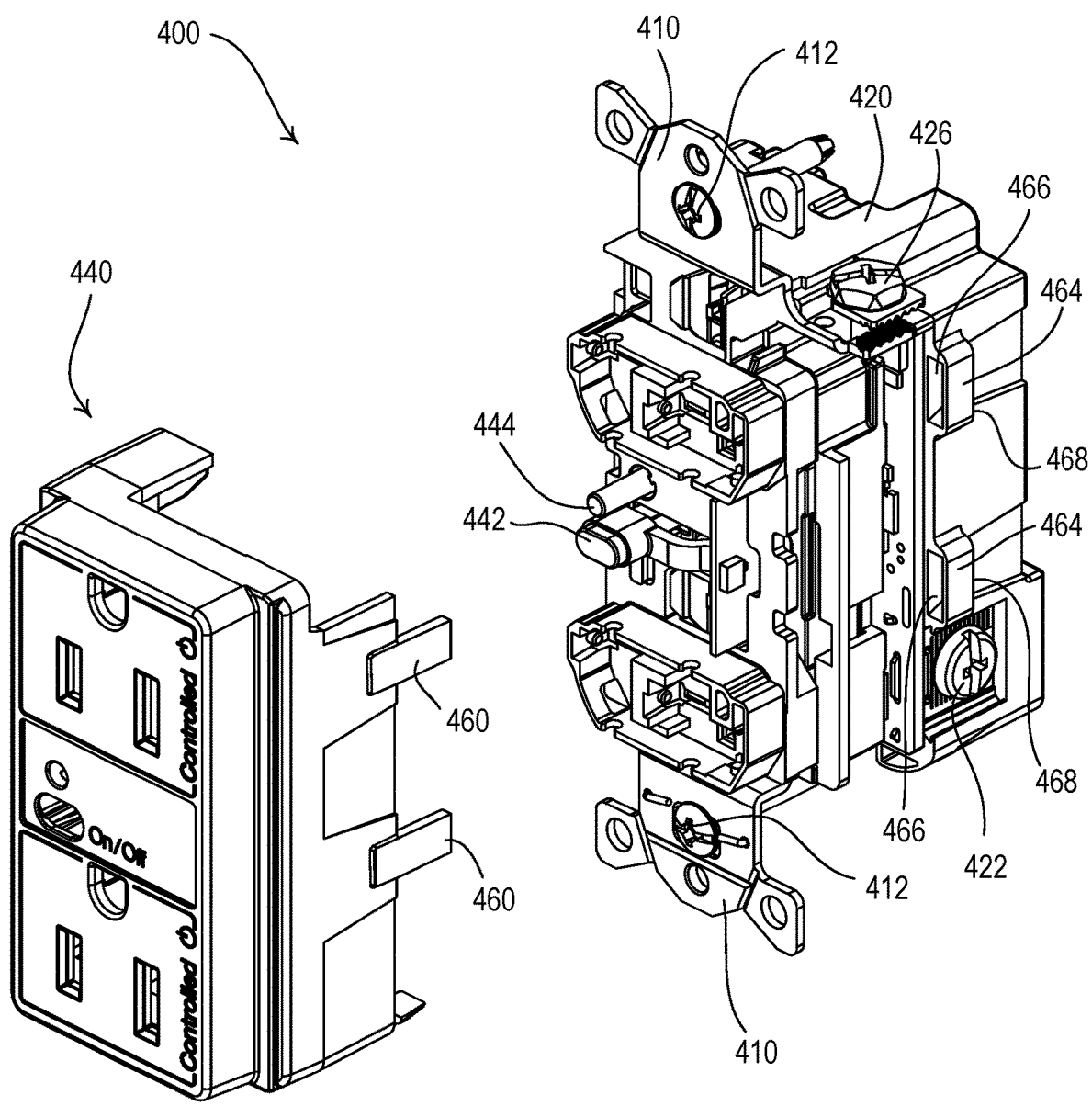
FIG. 14 is a perspective view of the electrical outlet of FIG. 13 with a temporary bezel detached.

The electrical outlet 400 may comprise a temporary bezel 440 that may be connected (e.g., temporarily connected) to the housing 420. The temporary bezel 440 may comprise, for example, attachment tabs 460 extending from the temporary bezel 440. The attachment tabs 460 may be configured to be received in openings 466 of respective attachment structures 464 in the housing 420 to connect the temporary bezel 440 to the housing 420. The temporary bezel 440 may be held in place when the attachment tabs 460 are received in the openings 466 of the respective attachment structures 464 (e.g., via a press fit or a friction fit) to temporarily connect the temporary bezel 440 to the housing 420. In addition, the attachment tabs 460 of the temporary bezel 440 may comprise snaps (not shown) that are located on an interior surface of the attachment tabs 460 and may be configured to be received in respective openings (not shown) in the housing 420 to temporarily connect the temporary bezel 440 to the housing 420 (e.g., the housing 420 may not require the attachment structures 464). The temporary bezel 440 may be detached from the housing 420 by simply pulling the temporary bezel 440 away from the housing 420 (e.g., by removing the attachment tabs 460 from the openings 466 of the respective attachment structures 464). FIG. 14 is a perspective view of the electrical outlet 400 showing the temporary bezel 440 detached form the housing 420. After the temporary bezel 440 is detached from the housing 420, a permanent bezel (e.g., the permanent bezel 350) may be attached to (e.g., permanently connected to) the housing 420 of the electrical outlet 400 (e.g., in a similar manner as the permanent bezel 350 is connected to the housing 320 of the electrical outlet 300 as shown in FIGS. 11 and 12).

The electrical outlets 300, 400 may be stored (e.g., stocked at a manufacturer and/or a warehouse) with the temporary bezels 340, 440 connected to the respective housings 320, 420 (e.g., in a bulk form). The permanent bezel 350 may be provided in a number of different colors, finishes, and/or materials. Prior to either of the electrical outlets 300, 400 being shipped to a customer, the respective temporary bezel 340 may be detached from the respective housing 320, 420 (e.g., as described above), and the permanent bezel 350 (e.g., having the desired color, finish, and/or material) may be attached to the housing.

In addition, an electrical outlet may be provided in different colors in other ways. For example, an electrical outlet may be stored (e.g., stocked at a manufacturer and/or a warehouse) with a permanent bezel (e.g., the permanent bezel 350) installed on the electrical outlet (e.g., as shown in FIG. 12). For example, the permanent bezel may be white when stored and may be painted a desired color prior to shipment of the electrical outlet to a customer (e.g., via an ink jet or 3D printed process). In addition, the permanent bezel may be tinted the desired color via a vinyl wrapping process. For example, a vinyl sheet of the desired color may be die cut to have openings that correspond to the openings of the front surface of a bezel of the electrical outlet (e.g., the openings 354*a*-358 of the front surface 352 of the permanent bezel 350 of the electrical outlet 300 shown in FIG. 12). The vinyl sheet may be located on the front surface of the bezel of the electrical outlet with the openings of the plastic sheet aligned with the openings of in the bezel of the electrical outlet. The vinyl sheet may then be adhered to the front surface and/or sidewalls of the bezel by smoothing the vinyl sheet out across the surfaces (e.g., using a squeegee).

While the controllable electrical outlets 100, 200, 300, 400 shown in FIGS. 1-14 have U.S. style receptacles, the controllable electrical outlets may alternatively or additionally have receptacles of styles used in other countries. In addition, the controllable electrical outlets 100, 200, 300, 400 could comprise other types of receptacles, for example, one or more Universal Serial Bus (USB) connectors, and an internal power supply for charging an electrical device, such as the battery of a smart phone.

What is claimed is:

1. An electrical outlet comprising:
   a housing portion having at least one terminal configured to be electrically coupled to a power source;
   a rear bezel portion having a planar front surface defining at least two openings configured to receive blades of a plug of an electrical device for electrically connecting the electrical device to the power source, the rear bezel portion including a plurality of apertures to insertably receive each of a corresponding plurality of front bezel portion fastening members; and
   a front bezel portion configured to be mounted over the rear bezel portion, the front bezel portion has at least two openings aligned with the respective openings of the rear bezel portion and is configured to receive the blades of the plug of the electrical device;
   wherein the front bezel portion includes a planar front surface and a planar rear surface transversely opposed across a thickness of the front bezel portion from the planar front surface; and
   wherein each of the plurality of front bezel portion fastening members extend orthogonally from the rear surface of the front bezel portion such that when each of the plurality of front bezel portion fastening members are inserted into corresponding ones of the plurality of apertures in the rear bezel portion, the planar rear surface of the front bezel portion is disposed proximate the planar front surface of the rear bezel portion.

2. The electrical outlet of claim 1, further comprising:
   an actuator received in an opening in the plate portion of the front bezel portion;
   wherein the electrical outlet is configured to be associated with a wireless transmitter in response to an actuation of the actuator.

3. The electrical outlet of claim 1, further comprising:
   an actuator received in an opening in the plate portion of the front bezel portion;
   wherein the electrical outlet is configured to turn an electrical device on and off in response to actuations of the actuator.

4. The electrical outlet of claim 1, further comprising:
   a visual indicator received in an opening in the plate portion of the front bezel portion;
   wherein the electrical outlet is configured to illuminate the visual indicator to provide feedback to a user of the electrical outlet.

5. The electrical outlet of claim 1, wherein the rear bezel portion further comprises snaps configured to engage respective attachment mechanisms of the housing to attach the rear bezel portion to the housing.

6. A method of manufacturing an electrical outlet comprising:
   storing the electrical outlet with a rear bezel portion installed, wherein the rear bezel portion includes a planar front surface defining at least two openings configured to receive blades of a plug of an electrical device for electrically connecting the electrical device to a power source;
   the rear bezel portion including a plurality of apertures to insertably receive each of a corresponding plurality of front bezel portion fastening members;
   installing a front bezel portion on the electrical outlet, the front bezel portion mountable over the rear bezel portion, the front bezel portion having at least two openings aligned with the respective openings of the rear bezel portion and is configured to receive the blades of the plug of the electrical device;
   wherein the front bezel portion includes a planar front surface and a planar rear surface transversely opposed across a thickness of the front bezel portion from the planar front surface; and
   wherein each of the plurality of front bezel portion fastening members extend orthogonally from the rear surface of the front bezel such that when each of the plurality of front bezel portion fastening members are inserted into corresponding ones of the plurality of apertures in the rear bezel, the planar rear surface of the front bezel portion is disposed proximate the planar front surface of the rear bezel portion; and shipping the electrical outlet with the front bezel portion mounted over the rear bezel portion.

7. A method of manufacturing an electrical outlet comprising:

installing a temporary bezel on a rear bezel portion of the electrical outlet, wherein the rear bezel portion includes a planar front surface defining at least two openings configured to receive blades of a plug of an electrical device for electrically connecting the electrical device to a power source;

the rear bezel portion including a plurality of apertures to insertably receive each of a corresponding plurality of front bezel portion fastening members;

storing the electrical outlet with the temporary bezel installed on the rear bezel portion;

removing the temporary bezel from the rear bezel portion of the electrical outlet;

installing a front bezel portion on the rear bezel portion of the electrical outlet, the front bezel portion mountable over the rear bezel portion, the front bezel portion having at least two openings aligned with the respective openings of the rear bezel portion and is configured to receive the blades of the plug of the electrical device;

wherein the front bezel portion includes a planar front surface and a planar rear surface transversely opposed across a thickness of the front bezel portion from the planar front surface; and wherein each of the plurality of front bezel portion fastening members extend orthogonally from the rear surface of the front bezel portion such that when each of the plurality of front bezel portion fastening members are inserted into corresponding ones of the plurality of apertures in the rear bezel portion, the planar rear surface of the front bezel portion is disposed proximate the planar front surface of the rear bezel portion; and shipping the electrical outlet with the front bezel portion installed on the rear bezel portion.

8. The method of claim 7, wherein installed the temporary bezel on the rear bezel portion of the electrical outlet comprises securing the temporary bezel to the rear bezel portion of the electrical outlet using snaps.

9. The method of claim 8, further comprising:

cutting the snaps prior to removing the temporary bezel from the rear bezel portion of the electrical outlet.

10. The method of claim 7, wherein installing the temporary bezel on the rear bezel portion of the electrical outlet comprises securing the temporary bezel to the rear bezel portion of the electrical outlet by inserting attachment tabs of the temporary bezel into openings of respective attachment structures of a housing of the electrical outlet.

11. The method of claim 10, wherein installing the temporary bezel on the rear bezel portion of the electrical outlet further comprises creating at least one of a press fit or a friction fit between the attachment tabs of the temporary bezel and the openings of the respective attachment structures.

* * * * *